United States Patent
Momoi et al.

(10) Patent No.: US 8,643,060 B2
(45) Date of Patent: Feb. 4, 2014

(54) METHOD FOR MANUFACTURING EPITAXIAL CRYSTAL SUBSTRATE, EPITAXIAL CRYSTAL SUBSTRATE AND SEMICONDUCTOR DEVICE

(75) Inventors: Hajime Momoi, Tokyo (JP); Koji Kakuta, Kitaibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 0 days.

(21) Appl. No.: 13/574,183

(22) PCT Filed: Jan. 19, 2011

(86) PCT No.: PCT/JP2011/050806
§ 371 (c)(1),
(2), (4) Date: Jul. 19, 2012

(87) PCT Pub. No.: WO2011/090040
PCT Pub. Date: Jul. 28, 2011

(65) Prior Publication Data
US 2012/0299061 A1    Nov. 29, 2012

(30) Foreign Application Priority Data

Jan. 20, 2010  (JP) ................................ 2010-010004

(51) Int. Cl.
*H01L 21/02* (2006.01)
*H01L 21/20* (2006.01)
*H01L 21/38* (2006.01)
*C30B 25/00* (2006.01)

(52) U.S. Cl.
USPC .................. 257/190; 257/E29.003; 438/481; 117/104

(58) Field of Classification Search
CPC ... H01L 21/0254; H01L 33/007; C30B 25/02; C30B 29/40; C30B 29/406

USPC ............. 257/190, 12, 14, E29.003; 438/150, 438/204, 481; 117/90, 88, 89, 104
See application file for complete search history.

(56) References Cited

U.S. PATENT DOCUMENTS 5,882,952 A * 3/1999 Kizuki et al. ................... 438/47
2007/0221954 A1 9/2007 Shibata

FOREIGN PATENT DOCUMENTS

JP   2003-309281 A   10/2003
JP   2007-246330 A    9/2007

OTHER PUBLICATIONS

Joyce et al., "Growth of II-V compounds on vicinal planes by molecular beam epitaxy", 1990, Semicond. Sci. Technol. vol. 5, pp. 1147-1154 Jul. 1990.*

(Continued)

*Primary Examiner* — Nikolay Yushin
(74) *Attorney, Agent, or Firm* — Birch, Stewart, Kolasch & Birch, LLP

(57) ABSTRACT

Disclosed is a technology of manufacturing, at low cost, an epitaxial crystal substrate provided with a high-quality and uniform epitaxial layer, said technology being useful in the case of growing the epitaxial layer composed of a semiconductor having a lattice constant different from that of the substrate. The substrate, which is composed of a first compound semiconductor, and which has a step-terrace structure on the surface, is used, and on the surface of the substrate, a composition modulation layer composed of a second compound semiconductor is grown by step-flow, while changing the composition in the same terrace. Then, the epitaxial crystal substrate is manufactured by growing, on the composition modulation layer, the epitaxial layer composed of the third compound semiconductor having the lattice constant different from that of the first compound semiconductor.

18 Claims, 4 Drawing Sheets

(56) References Cited

OTHER PUBLICATIONS

Ponchet et al., "Lateral modulations in zero-net-strained GaInAsP multilayers grown by gas source molecular-beam epitaxy", 1993, Journal of Applied Physics, vol. 74 No. 6 pp. 3778-3782, 15 Sep. 1.*

Rechkunov et al., "InAs/GaAs stacked lateral superlattices grown on vicinal GaAs (001) surfaces by molecular beam epitaxy", 1999, 7th Int. Symp. "Nanostructures: Physics and Technology", pp. 53-542, Jun. 14-18, 1999.*

Petroff, "Structure of AIAs-GaAs interfaces grown on (100) vicinal surfaces by molecular beam epitaxy", 1983, Applied Physics Letter.*

Norman et al., "The Nature and Origin of Lateral Composition Modulations in Short-period Starined-layer Superlattices", 2000, National Renewable Energy Laboratory, pp. 1-16, Feb. 2000.*

Dumont et al., "Strain-induced surface morphology of slightly mismatched $In_xGa_{1-x}As$ films grown on vicinal (100) substrates", 1999, Journal of Applied Physics.*

D'Hondt, M. et al., "Characterisation of 2% mismatched InGaAs and InAsP layers, grown on different buffer layers and at different growth temperatures", Journal of Crystal Growth, 1997, pp. 616-620, vol. 170.

International Search Report issued in PCT/JP2011/050806 mailed Mar. 22, 2011.

* cited by examiner

- InAs$_{0.30}$P$_{0.70}$
- InAs$_{0.25}$P$_{0.75}$
- InAs$_{0.20}$P$_{0.80}$
- InAs$_{0.15}$P$_{0.85}$
- InAs$_{0.10}$P$_{0.90}$
- InAs$_{0.05}$P$_{0.95}$
- InP
- InP SUBSTRATE

METHOD FOR MANUFACTURING EPITAXIAL CRYSTAL SUBSTRATE, EPITAXIAL CRYSTAL SUBSTRATE AND SEMICONDUCTOR DEVICE

TECHNICAL FIELD

The present invention relates to a method for manufacturing an epitaxial crystal substrate used in manufacturing a semiconductor device and in particular to a technique effective for an epitaxial layer that is not lattice-matched with a substrate.

BACKGROUND ART

In recent years, semiconductor devices used in laser diodes or light receiving elements have been put to practical use over a wide light wavelength range from near infrared to blue.

Substrates used in these semiconductor devices are usually manufactured by epitaxial growth. It has been well known that heterojunctions for connection of different materials are used in these substrates. Since a laser diode having a double heterojunction structure was proposed by H. Kroemer in 1962, heterojunctions have been practically used in various epitaxial growth techniques, such as, liquid phase epitaxy and vapor phase epitaxy.

In epitaxial growth of a semiconductor layer having a material different from that of a substrate, it is common knowledge to grow a semiconductor material having substantially the same lattice constant as that of the substrate. If a material having a lattice constant different from that of a substrate is used in such epitaxial growth, the difference in the lattice constant accumulates strain energy and then induces misfit dislocations in an epitaxial layer with a thickness exceeding a critical thickness. This forms a surface pattern called a cross hatch pattern. The misfit dislocation induced in the epitaxial layer degrades crystallinity in the epitaxial layer and precludes production of a high-performance device.

Recently, methods for epitaxial growth of a semiconductor layer having a lattice constant different from that of a substrate have been proposed, for example, a method for forming a strained super lattice in which a total amount of strain in an epitaxial layer is restricted below the strain of the critical thickness and a method for growing an epitaxial layer with a thickness exceeding the critical thickness (for example, refer to Patent Document 1).

According to Patent Document 1, in an InGaAsP material system, which is lattice-matched with an InP substrate having a bandgap of 1.35 eV, InGaAs having a bandgap of 0.75 eV can be grown on the InP substrate. In this case, the device can cover the light wavelength ranging from 0.92 to 1.65 μm. Patent Document 1 also discloses that the epitaxial growth can be carried out by metal organic chemical vapor deposition (MOCVD) or chloride vapor phase epitaxy (chloride VPE). In general, MOCVD is advantageous in productivity and a precise control of thickness and composition, so that at present most epitaxial crystal substrates used in semiconductor devices are manufactured by MOCVD.

A near-infrared region of 1.9 to 2.6 μm includes specific absorption bands inherent in water and various gasses. Hence, this region is available in sensors that measure the content of water in various materials from vapor to solid and radiation heat at a temperature in a middle range, for example, of 200 to 500° C. Such sensors are very effective in non-contact monitoring in various heating processes. If such image sensors can be manufactured at high yield using semiconductor devices, the image sensors will be effective and expected to be used in various applications such as process monitoring, quality control, and fire defense.

PRIOR ART DOCUMENT

Patent Document

Patent Document 1:
Japanese Patent Laid-open Publication No. 2003-309281

SUMMARY OF INVENTION

Problems to be Solved by the Invention

However, semiconductors available for the long-wavelength range (for example, $In_xGa_{1-x}As$ (x>0.54)) are significantly lattice-mismatched with a substrate. Hence, for epitaxial growth of these semiconductors, it is necessary to grow a strained InGaAs layer, or to grow a composition gradient layer of, for example, an InAsP or InAlAs material on an InP substrate in order to adjust the lattice constant. In such methods, the formed composition gradient layer is relatively thick (for example, 4 μm or more), so that a large number of misfit dislocations are induced when the thickness of the layer exceeds the critical thickness. This precludes growth of an epitaxial layer having high crystallinity.

Composition gradient layers have been known since long ago. In manufacture of a light-emitting diode (LED), epitaxial growth of a material, for example, GaAsP, on a GaP substrate is conventionally carried out by chloride VPE (vapor phase epitaxy) or hydride VPE. Metal organic chemical vapor deposition (MOCVD) has a growth rate lower than that of chloride VPE because of, for example, its restricted growth structure or crystallinity, so that in many cases the growth is carried out at 0.5 to 3.0 μm/hr. Hence, MOCVD is generally unsuitable for growth of an epitaxial layer having a total thickness of 10 μm or more.

Chloride VPE, which has a growth rate that is several times to several tens of times higher than that of MOCVD, allows the growth of a thick structure within a relatively short time. Unfortunately, it has poor uniformity of the gas flow direction in a reaction tube and often causes peripheral abnormal growth due to different crystal orientation on the periphery of a substrate. Moreover, surface defects caused by substances falling in a reaction tube largely affect manufacturing processes of elements afterward, so that chloride VPE is not suitable for manufacturing a large number of devices at low cost. In addition, in manufacture of image sensors which are practically used as integrated elements, these elements cannot have the same properties. This disadvantageously limits application of the image sensor.

The inventors have discovered growth conditions in MOCVD for manufacturing an epitaxial substrate as the result of extensive research. The resulting epitaxial substrate exhibits device characteristics that technically equivalent to those achieved by chloride VPE. In the epitaxial growth, it is essentially important to grow a thick epitaxial structure of 10 μm or more, which is equivalent to the structure achieved by chloride VPE. The growth conditions in MOCVD enable an epitaxial substrate having higher quality to be manufactured because of improved purity and uniformity inherent in the MOCVD process.

More specifically, ternary mixed crystals of $InAs_xP_{1-x}$ are grown on an InP substrate at a growth temperature of 600° C. under a pressure of 50 Torr by using TMIn, $AsH_3$, and $PH_3$ as material gases and $H_2$ as a carrier gas. In this process, the composition in an InAsP solid phase can be controlled by precisely changing a gas flow ratio between $AsH_3$ and $PH_3$. The impurity level can also be controlled using a $SiH_4$ dopant gas, so that an InAsP epitaxial layer having any resistivity from high resistivity to low resistivity can be obtained.

During the growth of the composition gradient layer described above, the composition is usually varied gradually or stepwise with time because a large change in composition at a time causes formation of a polycrystalline layer, surface roughness, or substrate warp during the growth, and then abnormal growth. However, as is well known, if the thickness of an epitaxial layer exceeds the critical thickness, a cross hatch pattern having a grid shape is formed due to misfit dislocations. To study this phenomenon, the inventors have investigated composition gradient layers of InAsP grown by MOCVD.

FIG. 6 illustrates a transmission electron microscope (TEM) image of a composition gradient layer of $InAs_xP_{1-x}$ (x=0.05, 0.10, 0.15, 0.20, 0.25, 0.30) grown on an InP substrate. As shown in FIG. 6, irregular misfit dislocations are observed at sites where the composition is varied stepwise. Since the state of such irregularly induced dislocations varies depending on, for example, the uniformity of the substrate used or growth conditions, it is difficult to uniformly induce dislocations on a surface of a substrate. As a result, residual stress occurs in an epitaxial layer, or growth step spacing varies at the atomic level. This probably changes the growth rate, resulting in formation of a cross hatch pattern. In a worse case, unrelieved local strain causes cracks.

As shown in FIG. 7, when epitaxial layers of $In_{0.82}Ga_{0.18}As$ and $InAs_{0.62}P_{0.38}$, which function as a light receiving layer and a window layer, respectively, in a practical light receiving element, are grown on the composition gradient layer, surface morphology called a cross hatch pattern is emphasized on the surface. Initial small distortions ingrowth steps or defects become larger and more noticeable as the layer grows thicker, resulting in formation of an apparent cross hatch pattern.

In contrast, a significantly thin composition gradient layer can be grown, but the growth of a thin epitaxial layer cannot satisfactorily relieve the strain caused by lattice mismatch. Since the residual strain causes substrate warp or unsatisfactory morphology, a high-quality epitaxial layer cannot be formed under such residual crystal strain. Hence, in conventional art, it is essential to grow a thicker film through formation of epitaxial layers having thicknesses greater than the critical thickness with relief of strain.

Accordingly, in order to obtain a high-quality InAsP layer without cracks or impaired surface morphology, it is necessary to form a thick composition gradient layer of InAsP. This causes long-time epitaxial growth and increased manufacturing cost.

An object of the present invention is to provide a manufacturing technique that is useful in growth of an epitaxial layer of a semiconductor that have a lattice constant different from that of a substrate and that can produce an epitaxial crystal substrate having a uniform high-quality epitaxial layer at low cost.

Means for Solving the Problems

The invention of claim 1 is a method for manufacturing an epitaxial crystal substrate, including: preparing a substrate of a first compound semiconductor, the substrate having a step-terrace structure on the surface; growing a composition modulation layer of a second compound semiconductor on the surface of the substrate by a step-flow process while varying the composition of the composition modulation layer within the same terrace; and growing an epitaxial layer of a third compound semiconductor having a lattice constant different from a lattice constant of the first compound semiconductor on the composition modulation layer.

The invention of claim 2 is the method for manufacturing the epitaxial crystal substrate of claim 1, wherein the composition of the second compound semiconductor is varied such that the lattice constant of the second compound semiconductor decreases stepwise.

The invention of claim 3 is the method for manufacturing the epitaxial crystal substrate of claim 2, wherein the substrate is an off-angle substrate having orientation that tilts depending on a lattice mismatch between the first compound semiconductor and the third compound semiconductor.

The invention of claim 4 is the method for manufacturing the epitaxial crystal substrate of claim 3, wherein the composition modulation layer is deposited until steps in the step-terrace structure substantially disappear.

The invention of claim 5 is the method for manufacturing the epitaxial crystal substrate of claim 4, wherein the first compound semiconductor comprises InP, the second compound semiconductor comprises $In_xGa_{1-x}As$ (0≤x≤1), and the third compound semiconductor comprises $InAs_yP_{1-y}$ (y>0).

The invention of claim 6 is the method for manufacturing the epitaxial crystal substrate of any one of claims 1 to 5, wherein the composition modulation layer and the epitaxial layer are grown by metal organic chemical vapor deposition.

The process of accomplishing the present invention will now be described.

FIG. 1 illustrates a mechanism of epitaxial growth on a substrate. For simplicity, the description is focused on epitaxial growth of a group III-V compound semiconductor on a substrate that has orientation tilting from a reference plane (100) at an off angle θ (hereinafter, referred to as an off-angle substrate).

As shown in FIG. 1, a step-terrace structure formed on a surface of an off-angle substrate is composed of steps S that have a height corresponding to one atom or molecule and uniform plane surfaces T (terraces), at the atomic level. Non Patent Literature (Journal of Crystal Growth 179 (1997), pp. 18-25) indicates that a substrate has a rough surface at the atomic level after being polished, but the step-terrace structure appears on the surface of the substrate after the substrate is heated and maintained under an atmosphere of hydrogen or phosphine for a certain time.

The step-terrace structure probably remains in an epitaxial layer, depending on the level of surface migration of group III atoms and surface covering of group V atoms on a surface of a substrate. Here, the surface migration indicates that atoms which reach the surface of the substrate from a vapor phase diffuse and travel to a site of a step.

During epitaxial growth on the surface of the substrate having the step-terrace structure, an epitaxial layer usually grows by a mechanism referred to as step-flow growth. In the step-flow growth, atoms that reach the surface of the substrate are trapped by the potentials of the atoms at the surface of the substrate. The trapped atoms randomly travel on the surface, being affected by lattice vibration depending on the types of the atoms at the surface, and then eventually move from a terrace to a step. If the steps S are substantially formed in a linear shape and parallel to each other, the atoms that reach the surface of the substrate from a vapor phase will travel on the terraces T and rapidly reach the steps S. Then, crystal growth occurs and proceeds at the edges of the steps, so that the steps S seemingly flow on the surface. In FIG. 1, the steps S move from the left to the right based on the step-flow growth.

In this growth, the surface migration rate varies depending on growth temperature, partial pressures of gasses, or types of atoms. In particular, group V atoms have particular bounding structures on the surface; hence, they need to have sufficient surface covering.

If the rate of surface migration, that is, the rate of the group III atoms surface migrating to the steps is sufficiently higher than the rate of the atoms reaching on the surface of the substrate, a step-terrace structure is also formed on the epitaxial layer. If the rate of surface migration is not sufficiently high, the atoms reached on the surface are trapped by other atoms on the terraces T, resulting in gradual formation of an island structure. This may cause formation of surface roughness when the layer grows thick.

Formation of a step-terrace structure can be observed, for example, with an atomic force microscope (AFM). The mechanism of the step-flow growth is essential, by which the atoms that attach to the surface of the substrate are regularly aligned along with the crystal of the substrate.

With reference to a right triangle defined by a difference (height) A in a step S and a distance B between the neighboring steps S (width of a terrace T) shown in FIG. 2, if the difference A corresponding to one molecular layer can be filled with a buffer layer that is grown on the surface of the substrate at a tilt angle, the buffer layer will seemingly have a lattice constant corresponding to the hypotenuse C of the right triangle (i.e., 1/cos θ of the lattice constant of the substrate) on the surface. In this case, an epitaxial layer of a semiconductor that is lattice-matched with the buffer layer can be grown.

It is known that the width of the terrace T formed on the surface of the substrate is adjusted by tilt of the orientation of the substrate (off angle). Here, the off angle θ is defined by the hypotenuse C of the right triangle and the terrace.

Epitaxial growth of a semiconductor material that has a lattice constant different from that of a substrate accumulates strain energy in the epitaxial layer due to a difference in the lattice constants. Strain energy exceeding the critical value for induction of dislocation will induce misfit dislocations. The strain energy is determined by the amount of the stain and thickness.

During the growth before the induction of the misfit dislocations, crystal lattices are elastically strained. It is known that the strained crystal has the same lattice constant as the substrate in the lateral direction (in the in-plane direction of the terrace), but has a lattice constant slightly larger than that of an unstrained layer due to free extension of the crystal in the vertical direction (in the direction of the height of the step). The amount of the strain is approximately two times larger because of a relation between the vertical and lateral elastic moduli. That is, if a material that has an unstrained lattice constant different from that of a substrate by 1% is grown, the resulting epitaxial layer will be strained by about 2% in the vertical direction.

For example, in growth of an epitaxial layer of InAs or GaAs on an InP substrate, InP, InAs, and GaAs have respectively lattice constants of 5.86 Å, 6.05 Å, and 5.63 Å; hence, lattice mismatches Δa/a of InAs and GaAs with InP are +3.2% and −3.9%, respectively.

Here, the lattice mismatch Δa/a is defined by the following equation;

$$\Delta a/a = (a_{epi} - a_{sub})/a_{sub},$$

where
$a_{epi}$: the lattice constant of an epitaxial layer, and
$a_{sub}$: the lattice constant of a substrate.

Since a lattice is strained approximately twofold in the vertical direction, the epitaxial layer of InAs and GaAs foamed on the InP substrate are respectively strained by +6.4% and −7.8%. Thus, if InAs and GaAs are grown side by side within a terrace at the surface of the InP substrate, at most 14.2% difference will be produced. Hence, if about two to ten stacks of composition modulation layers of $In_xGa_{1-x}As$ (0≤x≤1) are deposited within the terrace at the surface of the InP substrate where the In content x is varied stepwise, the difference in the step can be minimized, so that the atoms that reach the step cannot be affected by different potentials at the step.

The inventers of the present invention have investigated epitaxial growth of semiconductors that have lattice constants larger than that of a substrate, in view of the growth mechanism and vertical strain in the step-flow growth described above. More specifically, growth of an epitaxial layer having a lattice constant different from that of a substrate has been attempted, in which periodic bumps were intentionally formed on the surface of the substrate having an initial step-terrace structure due to vertical elastic strain to moderate the initial step-terrace structure on the surface of the substrate.

The inventors have proposed a method for filling the difference A shown in FIG. 2 by epitaxial growth of a composition modulation layer (buffer layer) of a compound semiconductor (for example, $In_xGa_{1-x}As$) where the composition is varied stepwise within the terrace at the surface of the substrate. The inventors have discovered that this method can grow a preferable epitaxial layer of a compound semiconductor having a lattice constant corresponding to the hypotenuse C, and then accomplished the present invention.

As shown in FIG. 2, when the orientation of the substrate tilts at an off angle θ from the plane (1 0 0), a semiconductor that has a lattice constant equivalent to 1/cos θ of the lattice constant of the substrate can be epitaxially grown on the substrate. For example, if the substrate has an off angle θ of 5°, a semiconductor having a lattice mismatch of 0.38% with the substrate can be epitaxially grown on the substrate. In conventional epitaxial growth, a lattice mismatch with a substrate is desirably 0.1% or less. Hence, this method enables epitaxial growth of a semiconductor having a composition that precludes epitaxial growth in conventional art.

In this manner, a high-quality epitaxial crystal substrate can be stably manufactured at low cost, taking advantages of metal organic chemical vapor deposition.

Effect of the Invention

According to the present invention, since poor crystallinity of an epitaxial layer due to lattice mismatch can be prevented during growth of an epitaxial layer of a semiconductor having a lattice constant different from that of a substrate, the resulting epitaxial crystal substrate can have a uniform high-quality epitaxial layer. Since a composition modulation layer formed on the substrate is much thinner than conventional composition gradient layers, the layer can be grown within a short time at low manufacturing cost.

BEST MODE FOR CARRYING OUT THE INVENTION

An embodiment of the present invention will be described with reference to attached drawings below.

In the embodiment, a composition modulation layer of $In_xGa_{1-x}As$ (0≤x≤1) is formed on an InP substrate and an epitaxial layer of $InAs_yP_{1-y}$ (y=0.12) is grown thereon by MOCVD.

Since InP and $InAs_{0.12}P_{0.88}$ have respectively lattice constants of 5.86 Å and 5.883 Å, their lattice mismatch is as large as 0.39%. Hence, an epitaxial layer of $InAs_{0.12}P_{0.88}$ grown directly on the InP substrate has poor crystallinity. In the embodiment, a composition modulation layer of $In_xGa_{1-x}As$ (0≤x≤1) is formed on the InP substrate, so that poor crystallinity, which is caused by dislocation due to lattice mismatch, can be prevented in the epitaxial layer of $InAs_{0.12}P_{0.88}$.

An InP substrate is prepared which has orientation tilting at a slight off angle θ from a predetermined orientation (for example, (1 0 0)). Here, the off angle of the substrate is determined in view of a lattice mismatch between a substrate and a semiconductor to be grown on the substrate.

Figure 3:
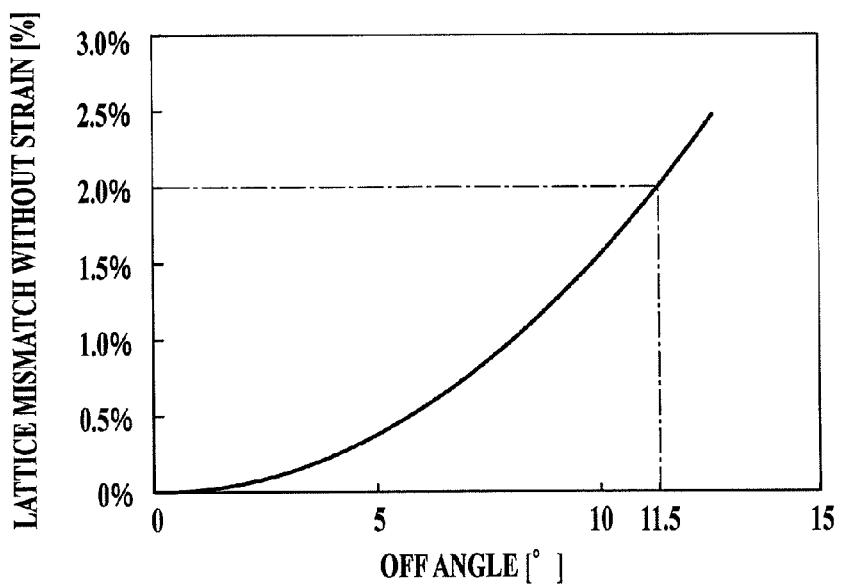
FIG. 3 This is a drawing illustrating the relation between an off angle of a substrate and a lattice mismatch of the substrate and a semiconductor without strain due to a composition modulation layer.

FIG. 3 illustrates the relation between an off angle of a substrate and a lattice mismatch (1−cos θ)/cos θ of the substrate and a semiconductor without strain due to a composition modulation layer. FIG. 3 indicates that a substrate having an off angle of 11.5° can be used to grow a crystal having a lattice constant larger than that of a substrate by 2%. In the embodiment, since the lattice mismatch of InP and $InAs_{0.12}P_{0.88}$ is 0.39%, the off angle θ of the InP substrate is desirably 5°.

The prepared InP substrate is disposed on a MOCVD system, and a step-terrace structure is formed on the surface of the substrate by heating in vacuum or in gas which mainly contain hydrogen atoms.

A composition modulation layer of $In_xGa_{1-x}As$ (0≤x≤1) is then grown by a step-flow process where the composition of the composition modulation layer is varied within the same terrace.

In the embodiment, to epitaxially grow InAsP having a lattice constant larger than that of an InP substrate in the last process step, the composition of $In_xGa_{1-x}As$ (0≤x≤1) is varied such that the lattice constant of the $In_xGa_{1-x}As$ (0≤x≤1) decreases stepwise in the composition modulation layer. For example, the In content x is varied stepwise to 1, 0.5, and 0 and thereby the composition modulation layer is composed of InAs (x=1), GaInAs (x=0.5), and GaAs (x=0). That is, a plurality of quantum wires having different lattice constants constitutes each molecular layer, and several molecular layers are stacked to form composition modulation layers.

More specifically, when a terrace has a width corresponding to 100 molecules, one molecular layer includes a row of 100 molecules, which include, for example, 30 InAs molecules, 30 InGaAs molecules, 30 GaAs molecules, and 10 InGaAs molecules. The number of stacked layers in the composition modulation layer (corresponding to its thickness) is determined such that a difference in a step substantially disappears. That is, atoms that reach the step cannot be affected by different potentials at the step. Here, semiconductor layers having a thickness of 0.0043 μm in total (corresponding to 15 molecules) are repeatedly grown.

To effectively fill the difference in the steps, InAs having a large lattice constant is desirably grown from the bottom end of the step, and GaAs having a small lattice constant at the ridge end of the terrace. However, this process step is impractical in control. In practice, the last 10 molecules of InGaAs are grown at the site of the step to prevent a significant change in composition from the intended modulation composition, where the change in composition is caused by growth of GaAs from the bottom end of the step, or growth of InAs at the ridge end of the terrace.

Although InAs, GaInAs and GaAs that are included in the composition modulation layer are substantially lattice-mismatched with an InP substrate, no misfit dislocations due to the lattice mismatch are induced because of their thicknesses that are smaller than the critical thickness (about 0.005 μm for a quantum well structure, which corresponds to 17 molecular layers). The thicknesses of the grown layers are close to the critical thickness, but it is known that dislocations are not significantly induced when the thickness reach the critical thickness. In fact, dislocations are gradually induced as the thickness increases slightly over the critical thickness.

The composition modulation layer can be grown by any growth mode involving a step-flow process. For example, TMGa, TMIn, $PH_3$, and $AsH_3$ may be used as material gasses for a composition modulation layer. During growth of the composition modulation layer, the temperature and pressure are set at 580° C. and 0.008 MPa, respectively.

If one molecular layer includes a row of 100 molecules in the composition modulation layer, as described above, and the growth of the molecular layer takes ten seconds, supplies of material gasses are switched to grow InAs for three seconds, InGaAs for three seconds, GaAs for three seconds, and InGaAs for one second. To achieve sure migration, the supplies of gases are desirably stopped for a predetermined time (for example, three seconds) when the supplies of gasses are switched.

An epitaxial layer of $InAs_{0.12}P_{0.88}$ is then grown on the composition modulation layer. Since the lattice constant of the composition modulation layer is substantially equal to that of $InAs_{0.12}P_{0.88}$, a high-quality epitaxial layer is formed. In practice, the $InAs_{0.12}P_{0.88}$ having a thickness of about 2 μm exhibits high crystallinity with fewer dislocations.

[Simulation]

Figure 4:
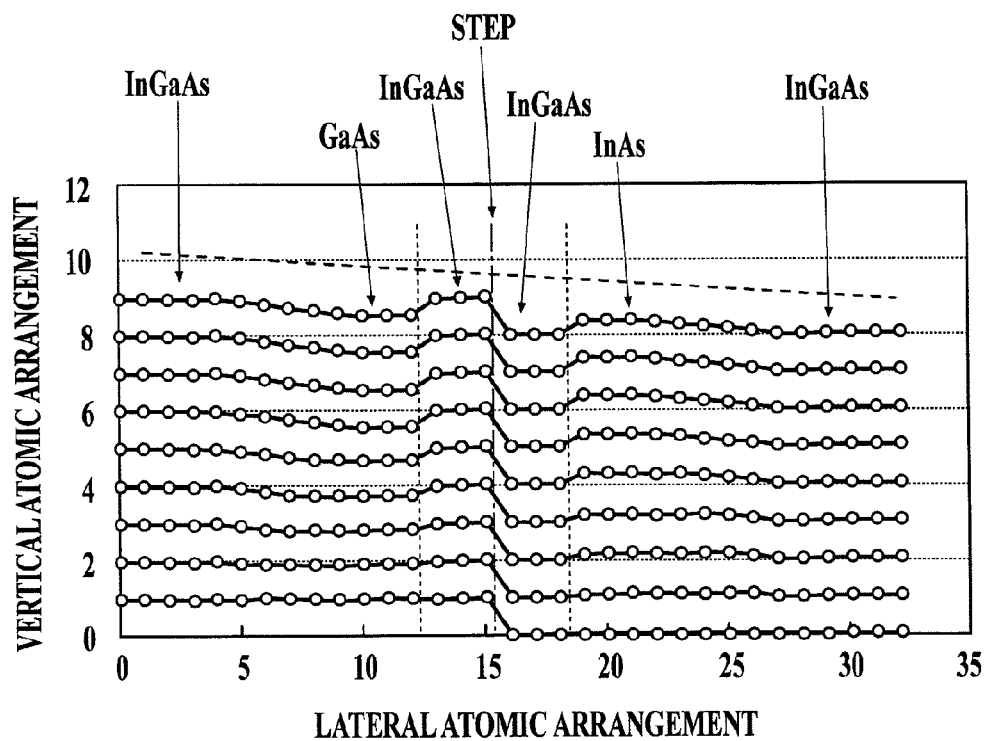
FIG. 4 This is a drawing illustrating the calculated results of atomic arrangement in a composition modulation layer of $In_xGa_{1-x}As$ (0≤x≤1) formed on an InP substrate.

FIG. 4 illustrates the calculated results for a composition modulation layer of $In_xGa_{1-x}As$ (0≤x≤1) formed on an InP substrate. In FIG. 4, a step is formed between the 15th and 16th atoms in a lateral atomic arrangement and a terrace has a width corresponding to 15 or more atoms aligned.

In FIG. 4, the difference corresponding to one molecular layer in the step is substantially cancelled on the surface after growth of about ten layers. If bumps are leveled over the surface of the composition modulation layer, the layer has seemingly a titling surface above the initial step. The difference in the step may induce a misfit dislocation around the 15th atom, which corresponds to the site of the initial step; thus, this can control a site of a dislocation line.

Introduction of both tensile strain and compressive strain within a terrace, as described above, seemingly produces fragile crystal, but in recent techniques to grow a strained multi-quantum well (MQW) structure, the introduction of both tensile strain and compressive strain for a reduction in total strain has been commonly used as a method for manufacturing crystal without a cross hatch pattern.

Methods for forming the above gradient of the composition within a terrace has been known, disclosed, for example, in Non Patent Literature (P. M. Petroff et al., J. Cryst. Growth 95 (1989), pp. 260-254). The composition modulation layer can be grown by such methods under some growth conditions. A more preferable composition modulation layer can be grown by controlling the timing of the switch of gasses as precisely as possible.

A composition modulation layer locally strained in a vertical direction can be prepared using such methods. Although the composition cannot be easily controlled with an atomic level precision so as to arrange each atom, a layer having significantly high crystallinity with fewer misfit dislocations can be achieved, in contrast to conventional techniques in which a layer having different composition is grown by intentionally maximizing the introduction of misfit dislocations corresponding to a lattice mismatch. In contrast to conventional growth involving formation of a composition gradient layer by stacking many layers, the composition modulation layer is composed of only several molecular layers; hence, the composition modulation layer can be grown within a significantly short time.

In this manner, an epitaxial crystal substrate of the embodiment is manufactured by the process steps of: preparing a substrate of a first compound semiconductor (InP) that has a step-terrace structure on the surface; growing a composition modulation layer of a second compound semiconductor (In$_x$Ga$_{1-x}$As) by a step-flow process while varying the composition within the same terrace; and epitaxially growing a third compound semiconductor (In$_y$As$_{1-y}$P) having a lattice constant different from that of the first compound semiconductor on the composition modulation layer.

Since poor crystallinity caused by lattice mismatch of the substrate and the epitaxial layer can be prevented, the epitaxial crystal substrate having a uniform high-quality epitaxial layer can be achieved. Moreover, since the composition modulation layer formed on the substrate is significantly thin (for example, 1 µm or less) compared with conventional composition gradient layers, the layer can be grown within a short time at low manufacturing cost.

When an epitaxial layer of In$_x$Ga$_{1-x}$As (x=0.60) having a lattice constant of 5.88 Å is grown on the high-quality epitaxial layer of InAs$_{0.12}$P$_{0.88}$, a resulting epitaxial crystal substrate can be suitable for a semiconductor device that can be used for the long wavelength range (λ=1.85 µm), which corresponds to an absorption band inherent in water in the air.

Furthermore, since dislocation sites induced in the composition modulation layer can be controlled, the epitaxial layer has high-quality morphology and foreign substances can be reduced during the growth. This moderates disadvantages of photolithography, which requires smooth surfaces in production of semiconductor devices.

The present invention achieved by the inventors has been specifically described above, with reference to an embodiment. However, the present invention should not be limited to the embodiment, and some modifications can be made within the scope of the present invention.

Figure 1:
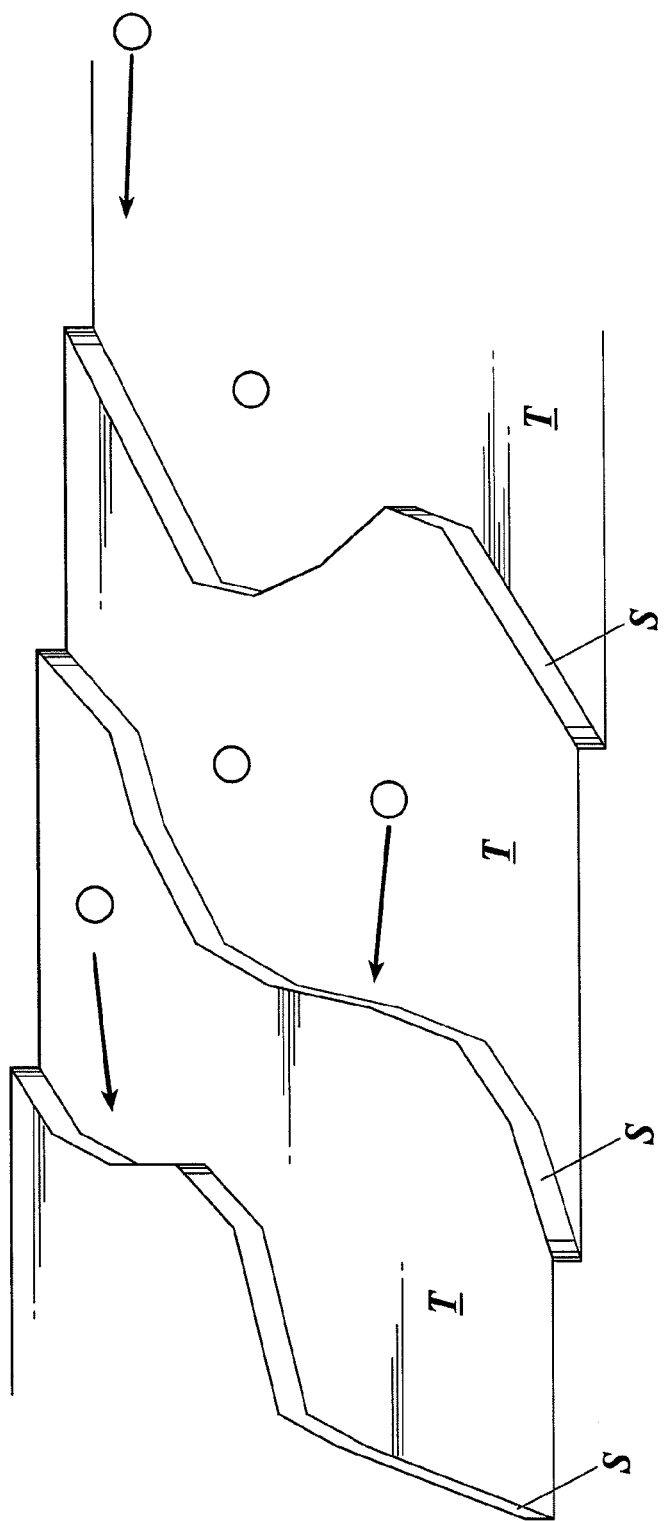
FIG. 1 This is a drawing illustrating the mechanism of epitaxial growth on a substrate.
Figure 2:
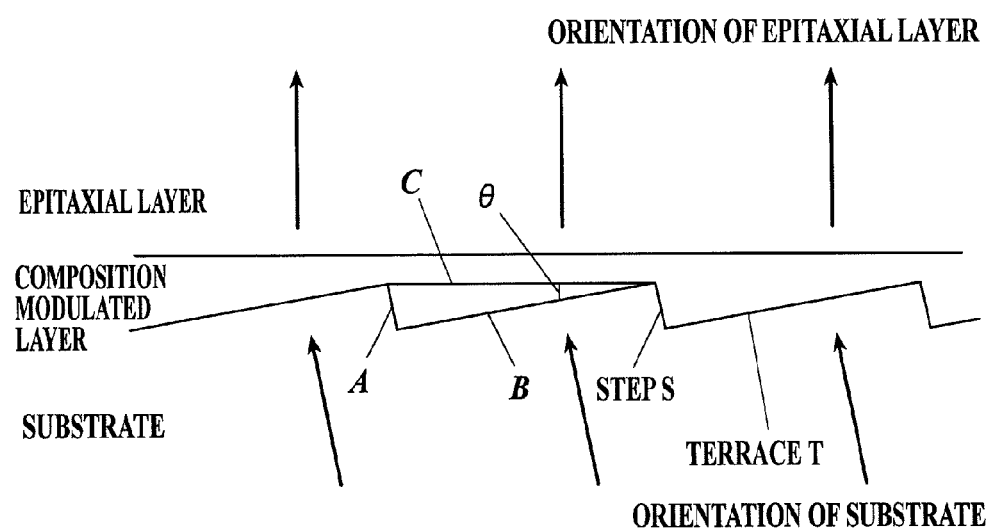
FIG. 2 This is a drawing illustrating the concept of the present invention.
Figure 5:
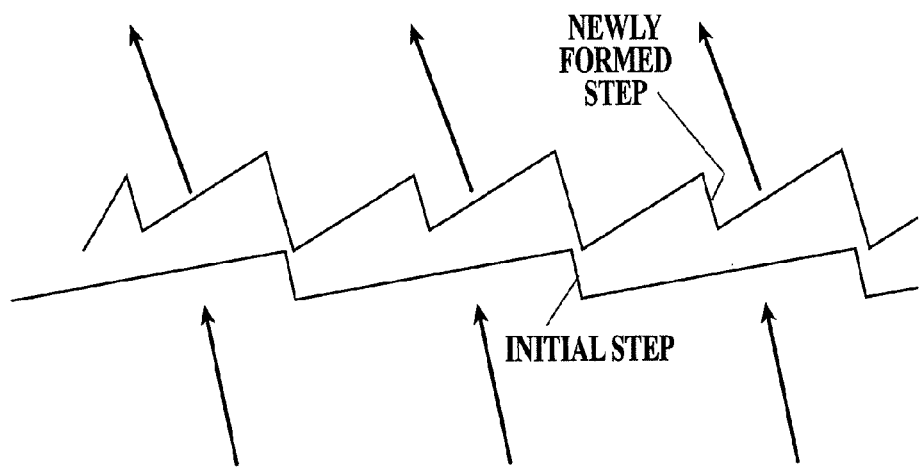
FIG. 5 This is a drawing illustrating an exemplary composition modulation layer to increase an off angle.
Figure 6:
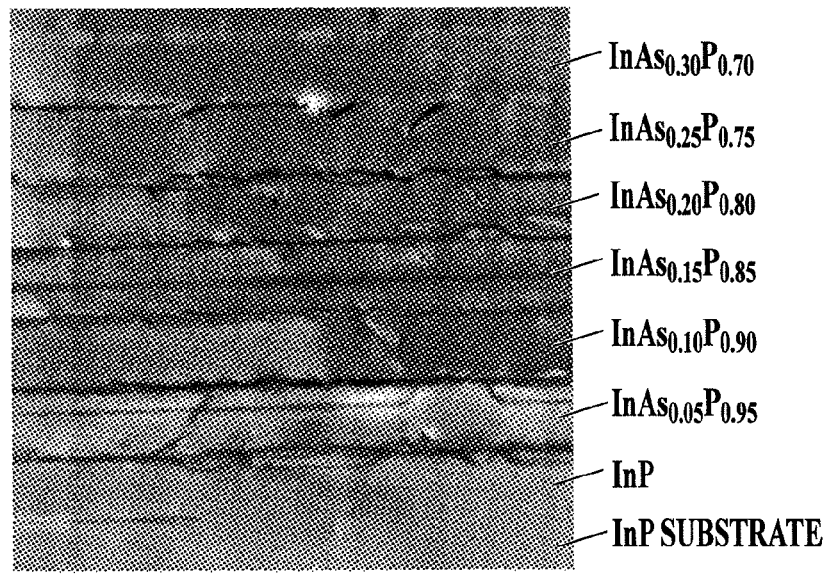
FIG. 6 This is a drawing illustrating an exemplary transmission electron microscopic image of a cross-section of a conventional epitaxial crystal substrate.
Figure 7:
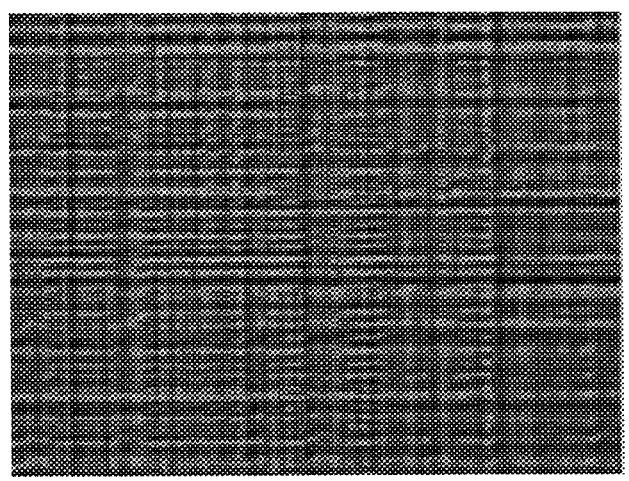
FIG. 7 This is a drawing illustrating an exemplary optical microscopic image of a surface of a conventional epitaxial crystal substrate.

In the above embodiment, a difference in an atomic step is cancelled, i.e., the off angle of a substrate is decreased due to vertical strain, as shown in FIG. 2. However, the off angle may be also increased by varying the composition of a compound semiconductor that forms a composition modulation layer such that the lattice constant of the compound semiconductor increases stepwise (refer to FIG. 5). In this manner, the orientation of an epitaxial layer grown on the top can be controlled by forming the composition modulation layer, without preparation of substrates having different off angles suitable for respective devices.

Moreover, if pairs of semiconductors having small/large or large/small lattice constants can be repetitively grown within a terrace at a surface of a substrate, a distance between steps can be probably halved by growth at a tilt angle. Using such a method by itself or in combination with other methods, constraints on the orientation of a substrate can be eased.

In the above embodiment, an epitaxial crystal substrate having an InAsP epitaxially grown on an InP substrate has been described. The present invention can be also applied to growth of another epitaxial layer of a semiconductor having a lattice constant different from that of a substrate on the substrate, for example, epitaxial growth of GaAs or InP on a Si substrate. In this case, the composition of a composition modulation layer may be preferably chosen within the composition range where poor crystallinity is prevented in the epitaxial layer.

The embodiment disclosed in the description should be considered to be illustrative and not restrictive in all respects. The scope of the invention is indicated by the appended claims rather than the foregoing description, and all modifications which come within the meaning and range of equivalents of the appended claims are intended to be embraced therein.

REFERENCE SIGNS LIST

A: difference in a step
B: distance between steps (width of a terrace)
C: hypotenuse
S: step
T: terrace
θ: off angle

The invention claimed is:
1. A method for manufacturing an epitaxial crystal substrate, comprising:
preparing a substrate of a first compound semiconductor, the substrate having a step-terrace structure on a surface of the substrate;
growing a second compound semiconductor on the surface of the substrate by a step-flow process while varying the composition of the second compound semiconductor within the same terrace such that the lattice constant of the second compound semiconductor varies stepwise to form a composition modulation layer consisting of a plurality of quantum wires having different lattice constants; and
growing an epitaxial layer of a third compound semiconductor having a lattice constant different of 0.39% or more as a lattice mismatch (Δa/a) from a lattice constant of the first compound semiconductor on the composition modulation layer, wherein the lattice mismatch is defined as

$$\Delta a/a = (a_{epi} - a_{sub})/a_{sub}$$

where $a_{epi}$ is the lattice constant of the epitaxial layer of the third compound semiconductor and $a_{sub}$ is the lattice constant of the first compound semiconductor.

2. The method for manufacturing the epitaxial crystal substrate of claim 1, wherein the composition modulation layer and the epitaxial layer are grown by metal organic chemical vapor deposition.

3. A method for manufacturing an epitaxial crystal substrate, comprising:
   preparing a substrate of a first compound semiconductor, the substrate having a step-terrace structure on a surface of the substrate;
   growing a second compound semiconductor on the surface of the substrate by a step-flow process while varying the composition of the composition modulation layer within the same terrace such that the lattice constant of the second compound semiconductor decreases stepwise to form a composition modulation layer consisting of a plurality of quantum wires having different lattice constants; and
   growing an epitaxial layer of a third compound semiconductor having a lattice constant different of 0.39% or more as a lattice mismatch (Δa/a) from a lattice constant of the first compound semiconductor on the composition modulation layer, wherein the lattice mismatch is defined as $$\Delta a/a = (a_{epi} - a_{sub})/a_{sub}$$

where $a_{epi}$ is the lattice constant of the epitaxial layer of the third compound semiconductor and $a_{sub}$ is the lattice constant of the first compound semiconductor.

4. The method for manufacturing the epitaxial crystal substrate of claim 3, wherein the substrate is an off-angle substrate having orientation that tilts depending on a lattice mismatch of the first compound semiconductor and the third compound semiconductor.

5. The method for manufacturing the epitaxial crystal substrate of claim 4, wherein the composition modulation layer is deposited until steps in the step-terrace structure substantially disappear.

6. The method for manufacturing the epitaxial crystal substrate of claim 5, wherein the first compound semiconductor comprises InP, the second compound semiconductor comprises $In_xGa_{1-x}As$ (0≤x≤1), and the third compound semiconductor comprises $InAs_yP_{1-y}$ (y>0).

7. An epitaxial crystal substrate, comprising:
   a substrate of a first compound semiconductor, the substrate having a step-terrace structure on a surface of the substrate;
   a composition modulation layer of a second compound semiconductor grown by a step-flow process on the surface of the substrate while varying the compositions of the wires within the same terrace such that the lattice constant of the second compound semiconductor varies stepwise, the composition modulation layer having molecular layers consisting of a plurality of quantum wires having different lattice constants; and
   an epitaxial layer on the composition modulation layer, the epitaxial layer consisting of a third compound semiconductor having a lattice constant different of 0.39% or more as a lattice mismatch (Δa/a) from a lattice constant of the first compound semiconductor, wherein the lattice mismatch is defined as $$\Delta a/a = (a_{epi} - a_{sub})/a_{sub}$$

where $a_{epi}$ is the lattice constant of the epitaxial layer of the third compound semiconductor and $a_{sub}$ is the lattice constant of the first compound semiconductor.

8. The epitaxial crystal substrate of claim 7, wherein the composition modulation layer and the epitaxial layer are grown by metal organic chemical vapor deposition.

9. A semiconductor device made from the epitaxial crystal substrate of claim 7, wherein the composition modulation layer and the epitaxial layer are grown by metal organic chemical vapor deposition.

10. An epitaxial crystal substrate, comprising:
    a substrate of a first compound semiconductor, the substrate having a step-terrace structure on a surface of the substrate;
    a composition modulation layer of a second compound semiconductor grown by a step-flow process on the surface of the substrate while varying the composition of the composition modulation layer within the same terrace such that the lattice constant of the second compound semiconductor decreases stepwise; and
    an epitaxial layer on the composition modulation layer, the epitaxial layer consisting of a third compound semiconductor having a lattice constant different of 0.39% or more as a lattice mismatch (Δa/a) from a lattice constant of the first compound semiconductor, wherein the lattice mismatch is defined as $$\Delta a/a = (a_{epi} - a_{sub})/a_{sub}$$

where $a_{epi}$ is the lattice constant of the epitaxial layer of the third compound semiconductor and $a_{sub}$ is the lattice constant of the first compound semiconductor.

11. A semiconductor device made from the epitaxial crystal substrate of claim 10, wherein the substrate is an off-angle substrate having orientation that tilts depending on a lattice mismatch of the first compound semiconductor and the third compound semiconductor.

12. The epitaxial crystal substrate of claim 10, wherein the substrate is an off-angle substrate having orientation that tilts depending on a lattice mismatch of the first compound semiconductor and the third compound semiconductor.

13. A semiconductor device made from the epitaxial crystal substrate of claim 12, wherein the composition modulation layer is deposited until steps in the step-terrace structure substantially disappear.

14. The epitaxial crystal substrate of claim 12, wherein the composition modulation layer is deposited until steps in the step-terrace structure substantially disappear.

15. A semiconductor device made from the epitaxial crystal substrate of claim 14, wherein the first compound semiconductor comprises InP, the second compound semiconductor comprises $In_xGa_{1-x}As$ (0≤x≤1), and the third compound semiconductor comprises $InAs_yP_{1-y}$ (y>0).

16. The epitaxial crystal substrate of claim 14, wherein the first compound semiconductor comprises InP, the second compound semiconductor comprises $In_xGa_{1-x}As$ (0≤x≤1), and the third compound semiconductor comprises $InAs_yP_{1-y}$ (y>0).

17. A semiconductor device made from an epitaxial crystal substrate, comprising:
    a substrate of a first compound semiconductor, the substrate having a step-terrace structure on a surface of the substrate;
    a composition modulation layer of a second compound semiconductor grown by a step-flow process on the surface of the substrate while varying the compositions of the wires within the same terrace such that the lattice constant of the second compound semiconductor varies stepwise, the composition modulation layer having molecular layers consisting of a plurality of quantum wires having different lattice constants; and an epitaxial layer on the composition modulation layer, the epitaxial layer consisting of a third compound semiconductor having a lattice constant different of 0.39% or more as a lattice mismatch ($\Delta a/a$) from a lattice constant of the first compound semiconductor, wherein the lattice mismatch is defined as $$\Delta a/a = (a_{epi} - a_{sub})/a_{sub}$$

where $a_{epi}$ is the lattice constant of the epitaxial layer of the third compound semiconductor and $a_{sub}$ is the lattice constant of the first compound semiconductor.

18. A semiconductor device made from an epitaxial crystal substrate, comprising:
   a substrate of a first compound semiconductor, the substrate having a step-terrace structure on a surface of the substrate;
   a composition modulation layer of a second compound semiconductor grown by a step-flow process on the surface of the substrate while varying the composition of the composition modulation layer within the same terrace such that the lattice constant of the second compound semiconductor decreases stepwise; and
   an epitaxial layer on the composition modulation layer, the epitaxial layer consisting of a third compound semiconductor having a lattice constant different of 0.39% or more as a lattice mismatch ($\Delta a/a$) from a lattice constant of the first compound semiconductor, wherein the lattice mismatch is defined as $$\Delta a/a = (a_{epi} - a_{sub})/a_{sub}$$

where $a_{epi}$ is the lattice constant of the epitaxial layer of the third compound semiconductor and $a_{sub}$ is the lattice constant of the first compound semiconductor.

* * * * *